United States Patent [19]
Halepete et al.

[11] Patent Number: 5,640,115
[45] Date of Patent: Jun. 17, 1997

[54] SELF-ENABLING LATCH

[75] Inventors: Sameer D. Halepete, Sunnyvale; James Burr, Foster City, both of Calif.

[73] Assignee: Sun Microsystems, Inc., Mountain View, Calif.

[21] Appl. No.: 566,049

[22] Filed: Dec. 1, 1995

[51] Int. Cl.$^6$ .......................... H03K 3/037; H03K 3/356
[52] U.S. Cl. .......................... 327/219; 327/73; 327/198; 327/211; 327/225
[58] Field of Search .......................... 327/22, 23, 203, 327/202, 210, 211, 214, 215, 219, 225, 73, 212, 198, 199, 208; 326/52, 55

[56] References Cited

U.S. PATENT DOCUMENTS

| | | | |
|---|---|---|---|
| 4,146,802 | 3/1979 | Moench | 327/208 |
| 5,081,377 | 1/1992 | Freyman | 327/211 |
| 5,144,168 | 9/1992 | Tran | 326/97 |
| 5,189,315 | 2/1993 | Akata | 327/203 |
| 5,306,970 | 4/1994 | Phillips | 327/73 |

OTHER PUBLICATIONS

Anantha P. Chandrakasan, Samuel Sheng and Robert W. Brodersen, "Low–Power CMOS Digital Design", IEEE Journal of Solid–State Circuits, vol. 27, No. 4, Apr. 1992, pp. 473–484.

Jiren Yuan and Christer Svensson, "High–Speed CMOS Circuit Technique", IEEE Journal of Solid–State Circuits, vol. 24, No. 1, Feb. 1989, pp. 62–70.

Yuan Ji–Ren, Ingemar Karlsson and Christer Svensson, "A True Single–Phase–Clock Dynamic CMOS Circuit Technique", IEEE Journal of Solid–State Circuits, vol. SC–22, No. 5, Oct. 1987, pp. 899–901.

Morteza Afghahi, "A Unified Single–Phase Clocking Scheme for VLSI Systems", IEEE Journal of Solid–State Circuits, vol. 25, No. 1, Feb. 1990, pp. 225–233.

*Primary Examiner*—Timothy P. Callahan
*Assistant Examiner*—Terry L. Englund
*Attorney, Agent, or Firm*—Limbach & Limbach L.L.P.

[57] ABSTRACT

A self-enabling latch includes a pair of pass transistors, a pair of cross-coupled inverters, an EXCLUSIVE-NOR logic gate and a differential amplifier. The pass transistors receive a differential input data signal which is selectively latched by the cross-coupled inverters. The EXCLUSIVE-NOR logic gate also receives the input data signal and compares it with the latched data signal to provide a control signal for the amplifier. The control signal is active when the present input data is different from the previously latched data. The amplifier, enabled by the active control signal, amplifies a differential clock signal to provide an enabling signal for the pass transistors which thereby present the new input data to the cross-coupled inverters for latching.

24 Claims, 3 Drawing Sheets

5,640,115

SELF-ENABLING LATCH

BACKGROUND OF THE INVENTION

1. Field of the Invention

The present invention relates to digital signal latches, and in particular, to digital signal latches having some measure of self control based upon the incoming data and the previously latched data.

2. Description of the Related Art

As the needs for and uses of portable, battery-operated computers and other types of systems become more varied and widespread, techniques for reducing the power consumption, both static and dynamic, of the digital integrated circuits used in such systems becomes increasingly important. One area of technology currently receiving much attention is that of chips using complementary metal oxide semiconductor field effect transistors (CMOSFETs).

However, even as advances are made with respect to reducing the power consumption of such chips, a number of areas continue to pose significant problems. An example of one such area involves the dynamic power consumption of a typical CMOSFET chip due to the on-chip distribution and use of a clock signal. The on-chip capacitance due to the distribution of the clock signal is typically a significant portion of the total chip capacitance. Accordingly, the dynamic power consumed by such capacitance is a significant percentage of the total power dissipation for the chip.

Therefore, it would be desirable to have a technique by which the dynamic power consumption due to the on-chip distribution and use of a clock signal can be reduced without adversely affecting the operation of functionality of the chip.

SUMMARY OF THE INVENTION

A self-enabling latch in accordance with the present invention advantageously minimizes the power dissipation due to the clock signal voltage swing and clock signal line capacitance by reducing the clock signal voltage swing and locally amplifying the clock signal voltage only when necessary. The input clock signal is distributed as a low amplitude signal and is amplified locally for use by the latch only when the data already latched therein is different from the present input data. Hence, the amplified clock transitions at the activity rate of the data rather than at every clock cycle.

A self-enabling latch in accordance with one embodiment of the present invention includes a data latch and a latch controller. The data latch is for receiving an input data signal and an enablement signal and in accordance therewith latching the input data signal for providing a latched data signal. The latch controller is coupled to the data latch and is for receiving a clock signal, the input data signal and the latched data signal and in accordance therewith providing the enablement signal. The input data signal includes a number of signal states as does the latched data signal. The data latch latches the input data signal only when the input data signal state is different from the latched data signal state.

These and other features and advantages of the present invention will be understood upon consideration of the following detailed description of the invention and the accompanying drawings.

DETAILED DESCRIPTION OF THE INVENTION

The dynamic power consumed by a typical CMOSFET chip depends on the clock swing as follows:

$$P_{clk} = C_{clk} * V_{dd}^2 * f + Q_{sc} * V_{dd} * f \quad (1)$$

where $C_{clk}$ is the load capacitance on the clock driver, $V_{dd}$ is the supply voltage, f is the frequency of operation, and $Q_{sc}$ is the short-circuit charge. The clock capacitance is usually a significant portion of the total chip capacitance and therefore the clock dynamic power is a significant percentage of the total chip power dissipation. A lot of the clock capacitance consists of gate capacitance of transistors that enable latches. If the activity on the data coming into the latch is small, enabling the latch every clock cycle is a waste of power.

However, if a self-enabling latch is used, the clock can be distributed as a low-swing differential voltage which is amplified locally only when high swing is required. The power in such a case becomes:

$$P_{clk} = C_{clk} * V_{dd\_clk} * V_{swing} * f + N * a * C_{local} * V_{dd\_latch}^2 * f \quad (2)$$

where $C_{clk}$ is the load capacitance on the clock driver, $V_{dd\_clk}$ is the supply voltage on the clock driver, $V_{swing}$ is the swing on the clock voltage, N is the total number of latches, a is the activity of the incoming data, $C_{local}$ is the local clock capacitance in each latch, and $V_{dd\_latch}$ is the supply voltage on the latched data. By reducing the swing on the global clock, the first component of the clock power dissipation is reduced accordingly. The second component is smaller for data having a lower activity rate. Therefore, there is a net power saving for an activity less than that of the clock.

Figure 1:
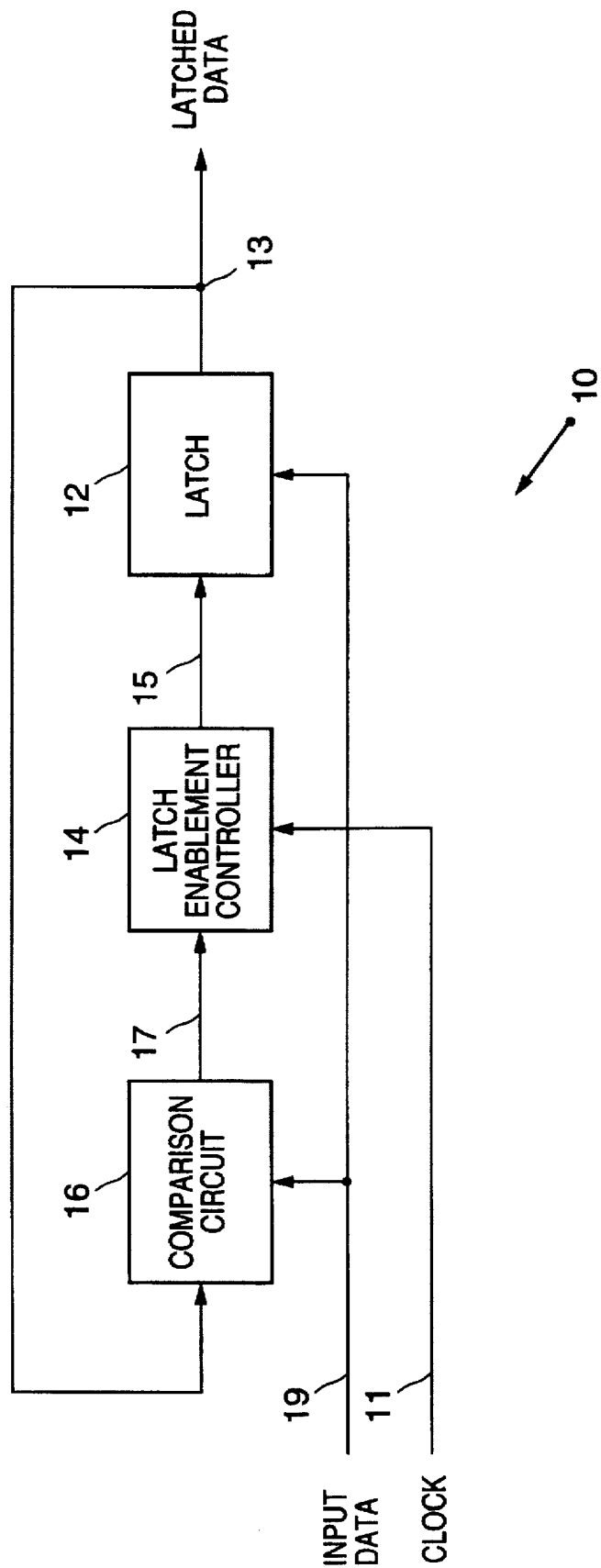
FIG. 1 is a functional block diagram of a self-enabling latch in accordance with one embodiment of the present invention.

Referring to FIG. 1, a self-enabling latch 10 in accordance with one embodiment of the present invention includes a latch circuit 12, a latch enablement controller 14 and a comparison circuit 16 interconnected substantially as shown. The previously latched data 13 is fed back to the comparison circuit 16 for comparison with the present input data 19. Based upon this comparison, the comparison circuit 16 generates a control signal 17 which is asserted when the present input data 19 is different from the previously latched data 13. In accordance with assertion of the control signal 17, the latch enablement controller 14 processes, i.e. amplifies, the clock signal 11 to generate an enablement signal 15 for the latch 12. This enablement signal 15 is active only when the present input data 19 is different from the previously latched data 13. Accordingly, the self-enabling latch 10 is active, with respect to actual latching of the present input data 19, only when the present input data 19 is different from the previously latched data 13.

As should be understood from the foregoing, due to the processing of the clock signal 11 by the latch enablement controller 14 only when necessary, i.e. when the present input data 19 differs from the previously latched data 13, the input clock signal 11 can be significantly reduced in amplitude, thereby significantly reducing the dynamic power necessary to drive the clock signal 11.

Figure 2:
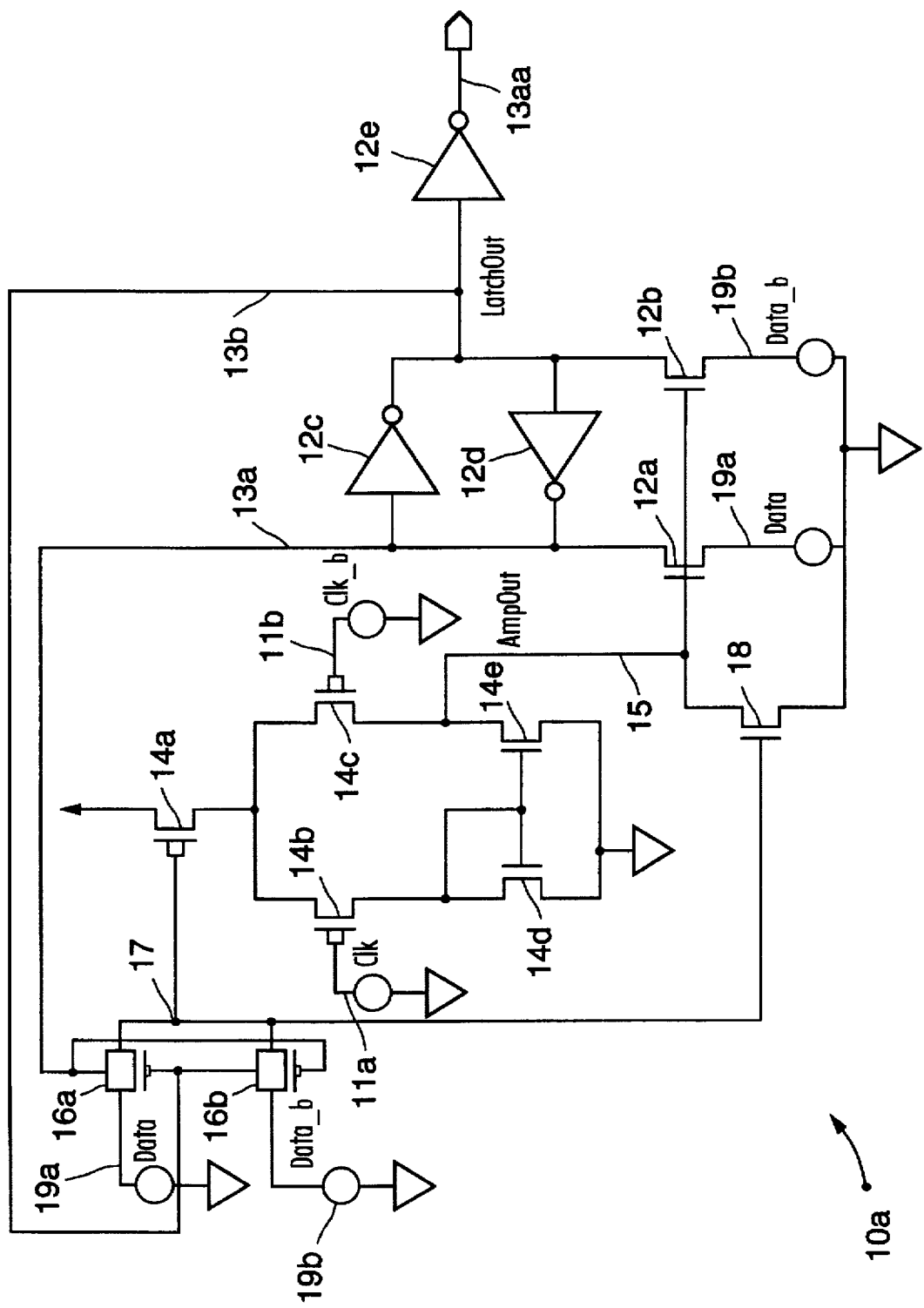
FIG. 2 is a schematic diagram of one embodiment of the self-enabling latch circuit of FIG. 1.

Referring to FIG. 2, one embodiment 10a of the self-enabling latch 10 of FIG. 1 can be realized as shown. The input clock signal 11 is a differential clock signal with opposing clock phases 11a, 11b. Similarly, the input data signal 19 is a differential signal with opposing phases 19a, 19b.

The latch 12 includes two pass transistors 12a, 12b which, in accordance with the enablement signal 15, pass the input data signal phases 19a, 19b to a pair of cross-coupled inverters 12c, 12d. The latched data 13 is provided in differential form with opposing latched data signal phases 13a, 13b. (In this embodiment, the latch 12 also includes an inverting buffer 12e for buffering the secondary phase 13b of the latched data 13 to provide a latched data output signal 13aa.)

The comparison circuit 16 includes two pairs 16a, 16b of pass transistors connected as transmission gates in a configuration which forms an EXCLUSIVE-NOR logic gate. These transmission gates 16a, 16b receive the input data signal phases 19a, 19b and latched data signal phases 13a, 13b. The resulting EXCLUSIVE-NOR output 17 is used as the control signal 17 for the latch enablement controller 14.

The latch enablement controller 14 includes a P-type MOSFET (PMOSFET) 14a used as a power control device and a differential amplifier formed by opposing PMOSFETs 14b, 14c which are biased by a current mirror formed by cross-connected N-type MOSFETs (NMOSFETs) 14d, 14e. The control signal 17 from the comparison circuit 16, when asserted (logic low), the power control transistor 14a is turned on and the differential amplifier is enabled. Accordingly, the differential clock signal phases 11a, 11b are amplified by the differential amplifier to produce the enablement signal 15 for the latch.

An additional NMOSFET 18 is connected to the node driven by the enablement signal 15 and is controlled by the control signal 17 from the comparison circuit 16. The function of this transistor 18 is to discharge such node when the enablement signal 15 is inactive, i.e. when no data latching is to take place (when the present input data 19 is equal to the previously latched data 13). This ensures that pass transistors 12a and 12b are turned off completely and new data does not inadvertently get written into the latch 12.

Figure 3:
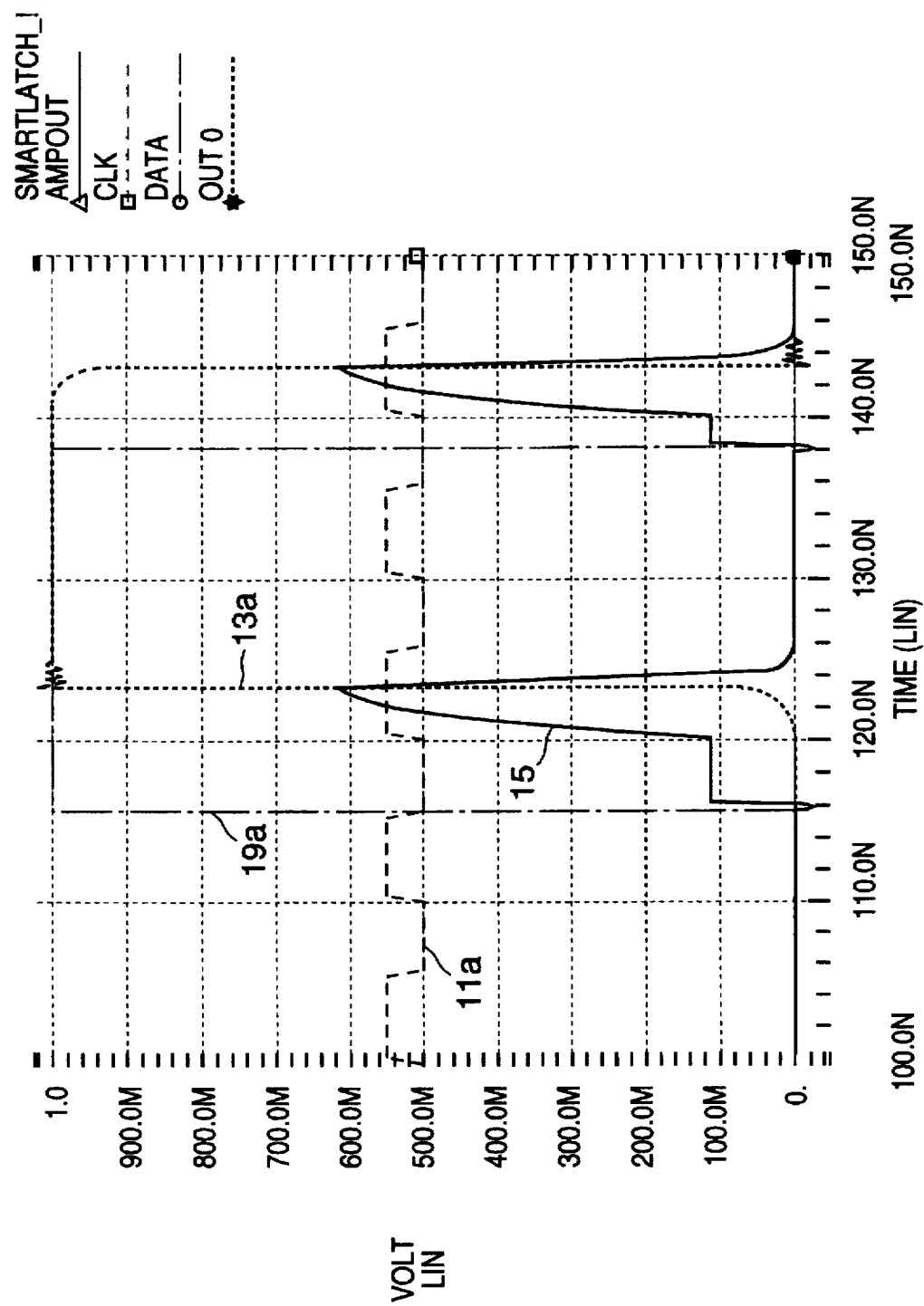
FIG. 3 is a voltage-versus-time diagram of the data and clock signals for the circuit of FIG. 2.

Referring to FIG. 3, the latch circuit 10a of FIG. 2 was simulated using HSPICE. (For the sake of simplicity in this timing diagram, only the primary phases ["a"] of the differential clock 11 and input 19 and output 13 data signal phases have been shown.) As shown, when the previously latched data 13 is different from the present input data 19, the low-amplitude input clock 11 is amplified and provided in the form of the enablement signal 15. This causes the latch 12 to function by latching the present input data 19. However, when the present input data 19 is the same as the previously latched data 13, the low-amplitude input clock 11 is not amplified.

Various other modifications and alterations in the structure and method of operation of this invention will be apparent to those skilled in the art without departing from the scope and spirit of the invention. For example, the self-enabling latch can be formed on an integrated circuit or used in a computer. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus which includes a self-enabling latch, said self-enabling latch comprising:

a data latch for receiving an input data signal and an enablement signal and in accordance therewith latching said input data signal for providing a latched data signal; and a latch controller, coupled to said data latch, for receiving a clock signal, said input data signal and said latched data signal and in accordance therewith providing said enablement signal;

wherein said input data signal includes a first plurality of signal states and said latched data signal includes a second plurality of signal states, and wherein said data latch latches said input data signal only when said input data signal state is different from said latched data signal state.

2. The apparatus of claim 1, wherein said enablement signal includes active and inactive signal states and is in said active signal state only when said input data signal state is different from said latched data signal state.

3. The apparatus of claim 1, wherein said data latch comprises:

a pair of pass transistors for receiving said input data signal and said enablement signal and in accordance therewith providing an enabled data signal; and a pair of cross-coupled inverters, coupled to said pair of pass transistors, for receiving and latching said enabled data signal and in accordance therewith providing said latched data signal.

4. The apparatus of claim 1, wherein said latch controller comprises:

a comparison circuit for receiving and comparing said input data signal and said latched data signal and in accordance therewith providing a control signal; and an enablement circuit, coupled to said comparison circuit, for receiving said clock signal and said control signal and in accordance therewith providing said enablement signal.

5. The apparatus of claim 4, wherein said comparison circuit comprises an EXCLUSIVE-NOR logic gate.

6. The apparatus of claim 4, wherein said enablement circuit comprises:

a pass transistor for receiving said control signal and in accordance therewith providing a power signal; and a differential amplifier, coupled to said pass transistor, for receiving said power signal and said clock signal and in accordance therewith providing said enablement signal.

7. The apparatus of claim 1 wherein said apparatus is an integrated circuit.

8. The apparatus of claim 1 wherein said apparatus is a computer.

9. A method of providing an apparatus including a self-enabling latch, said method comprising the steps of:

providing a data latch for receiving an input data signal and an enablement signal and in accordance therewith latching said input data signal for providing a latched data signal; and providing a latch controller, coupled to said data latch, for receiving a clock signal, said input data signal and said latched data signal and in accordance therewith providing said enablement signal;

wherein said input data signal includes a first plurality of signal states and said latched data signal includes a second plurality of signal states, and wherein said data latch latches said input data signal only when said input data signal state is different from said latched data signal state.

10. The method of claim 9, wherein said enablement signal includes active and inactive signal states and is in said active signal state only when said input data signal state is different from said latched data signal state.

11. The method of claim 9, wherein said step of providing a data latch comprises:

providing a pair of pass transistors for receiving said input data signal and said enablement signal and in accordance therewith providing an enabled data signal; and providing a pair of cross-coupled inverters, coupled to said pair of pass transistors, for receiving and latching said enabled data signal and in accordance therewith providing said latched data signal.

12. The method of claim 9, wherein said step of providing a latch controller comprises:

providing a comparison circuit for receiving and comparing said input data signal and said latched data signal and in accordance therewith providing a control signal; and providing an enablement circuit, coupled to said comparison circuit, for receiving said clock signal and said control signal and in accordance therewith providing said enablement signal.

13. The method of claim 12, wherein said step of providing a comparison circuit comprises providing an EXCLUSIVE-NOR logic gate.

14. The method of claim 12, wherein said step of providing an enablement circuit comprises:

providing a pass transistor for receiving said control signal and in accordance therewith providing a power signal; and providing a differential amplifier, coupled to said pass transistor, for receiving said power signal and said clock signal and in accordance therewith providing said enablement signal.

15. The method of claim 9, wherein said self-enabling latch is included in an integrate circuit.

16. The method of claim 9, wherein said self-enabling latch is incorporated into a computer.

17. A method of latching data in a self-enabling manner, said method comprising the steps of:

receiving an input data signal and an enablement signal and in accordance therewith latching said input data signal for providing a latched data signal; and receiving a clock signal, said input data signal and said latched data signal and in accordance therewith providing said enablement signal;

wherein said input data signal includes a first plurality of signal states and said latched data signal includes a second plurality of signal states, and wherein said input data signal is latched only when said input data signal state is different from said latched data signal state.

18. The method of claim 17, wherein said enablement signal includes active and inactive signal states and is in said active signal state only when said input data signal state is different from said latched data signal state.

19. The method of claim 17, wherein said step of receiving an input data signal and an enablement signal and in accordance therewith latching said input data signal for providing a latched data signal comprises:

receiving said input data signal and said enablement signal and in accordance therewith providing an enabled data signal; and receiving and latching said enabled data signal and in accordance therewith providing said latched data signal.

20. The method of claim 17, wherein said step of receiving a clock signal, said input data signal and said latched data signal and in accordance therewith providing said enablement signal comprises:

receiving and comparing said input data signal and said latched data signal and in accordance therewith providing a control signal; and receiving said clock signal and said control signal and in accordance therewith providing said enablement signal.

21. The method of claim 20, wherein said step of receiving and comparing said input data signal and said latched data signal and in accordance therewith providing a control signal comprises using an EXCLUSIVE-NOR logic gate.

22. The method of claim 20, wherein said step of receiving said clock signal and said control signal and in accordance therewith providing said enablement signal comprises:

receiving said control signal and in accordance therewith providing a power signal; and receiving said power signal and said clock signal and in accordance therewith providing said enablement signal.

23. The method of claim 17, wherein the steps are performed within an integrated circuit.

24. The method of claim 17, wherein the steps are performed within a computer.

* * * * *

UNITED STATES PATENT AND TRADEMARK OFFICE
CERTIFICATE OF CORRECTION

PATENT NO. : 5,640,115
DATED : June 17, 1997
INVENTOR(S) : SAMEER D. HALEPETE ET AL.

It is certified that error appears in the above-indentified patent and that said Letters Patent is hereby corrected as shown below:

In Col. 5, line 32, delete "integrate" and replace with --integrated--.

Signed and Sealed this

Fifth Day of August, 1997

Attest:

BRUCE LEHMAN

*Attesting Officer*        *Commissioner of Patents and Trademarks*